(12) United States Patent
Tomura et al.

(10) Patent No.: US 8,283,570 B2
(45) Date of Patent: Oct. 9, 2012

(54) SEMICONDUCTOR ASSEMBLY AND MULTILAYER WIRING BOARD

(75) Inventors: Yoshihiro Tomura, Osaka (JP); Shigeru Kondou, Osaka (JP); Teppei Iwase, Hyogo (JP)

(73) Assignee: Panasonic Corporation, Osaka (JP)

( * ) Notice: Subject to any disclaimer, the term of this patent is extended or adjusted under 35 U.S.C. 154(b) by 263 days.

(21) Appl. No.: 12/674,081

(22) PCT Filed: Nov. 11, 2008

(86) PCT No.: PCT/JP2008/003248
§ 371 (c)(1),
(2), (4) Date: Feb. 18, 2010

(87) PCT Pub. No.: WO2009/081518
PCT Pub. Date: Jul. 2, 2009

(65) Prior Publication Data
US 2011/0279996 A1    Nov. 17, 2011

(30) Foreign Application Priority Data
Dec. 26, 2007  (JP) .................................. 2007-334142

(51) Int. Cl.
*H05K 1/00* (2006.01)
(52) U.S. Cl. ........................................ 174/258; 361/760
(58) Field of Classification Search .................. 174/260, 174/262, 255; 361/820, 760
See application file for complete search history.

(56) References Cited

U.S. PATENT DOCUMENTS

| | | | |
|---|---|---|---|
| 5,593,526 A * | 1/1997 | Yokouchi et al. | 156/89.15 |
| 7,462,784 B2 * | 12/2008 | Kariya et al. | 174/260 |
| 2003/0169575 A1 * | 9/2003 | Ikuta et al. | 361/761 |
| 2005/0146854 A1 | 7/2005 | Ikuta et al. | |
| 2006/0105227 A1 * | 5/2006 | Kim et al. | 429/44 |
| 2007/0166438 A1 * | 7/2007 | Kitahata et al. | 426/242 |
| 2010/0294544 A1 * | 11/2010 | Momota et al. | 174/254 |

FOREIGN PATENT DOCUMENTS

| | | |
|---|---|---|
| JP | 62-206861 | 9/1987 |
| JP | 2001-217514 | 8/2001 |
| JP | 2002-359327 | 12/2002 |
| WO | WO2007/013595 | * 2/2007 |

* cited by examiner

*Primary Examiner* — Yuriy Semenenko
(74) *Attorney, Agent, or Firm* — McDermott Will & Emery LLP

(57) ABSTRACT

A semiconductor assembly includes a multilayer wiring board including at least three insulating layers, first, second and third insulating layers and a semiconductor device attached to one principal surface of the first insulating layer. The first, second and third insulating layers are stacked in this order. The multilayer wiring board further includes a heat-insulating member made of a material having a lower thermal conductivity than the insulating layers. The heat-insulating member is disposed between the first and second insulating layers or next to the first insulating layer at a side opposite to the one principal surface.

12 Claims, 9 Drawing Sheets (a)

(b)

SEMICONDUCTOR ASSEMBLY AND MULTILAYER WIRING BOARD

RELATED APPLICATIONS

This application is the U.S. National Phase under 35 U.S.C. §371 of International Application No. PCT/JP2008/003248, filed on Nov. 11, 2008, which in turn claims the benefit of Japanese Application No. 2007-334142, filed on Dec. 26, 2007, the disclosures of which Applications are incorporated by reference herein.

TECHNICAL FIELD

The present invention relates to a semiconductor assembly including semiconductor devices flip-chip bonded to a multilayer wiring board, and also to the multilayer wiring board used in the semiconductor assembly.

BACKGROUND ART

In recent years, to meet the need to reduce the size and the thickness of electronic equipment, there have been developed semiconductor assemblies with bare semiconductor devices directly mounted on a wiring board. One such type of semiconductor assembly employs "flip-chip mounting" technology.

The "flip-chip mounting" technology is one of the methods for mounting the semiconductor device (chip) on the wiring board, in which projecting terminals called bumps are provided and arranged in a matrix on one principal surface of the planar semiconductor device, and the terminals are connected to electrodes provided in the wiring board. Hereinafter, a semiconductor assembly employing "flip-chip mounting" will be referred to as a "flip-chip-type" semiconductor assembly, and such a connection method will be referred to as "flip-chip bonding".

The flip-chip-type semiconductor assembly has a reduced mounting area compared to semiconductor assemblies employing wire bonding. Also, short wiring advantageously provides satisfactory electrical characteristics.

In the flip-chip-type semiconductor assembly, semiconductor devices are typically mounted on a multilayer wiring board. The wiring board has wiring patterns formed on two principal surfaces, and the wiring patterns are electrically connected to each other through vias formed in the wiring board. One of the two wiring patterns is connected to internal connection terminals (bumps) of the semiconductor devices, while the other is connected to external connection terminals such as solder balls. Also, thermo-setting resin, such as epoxy resin, is injected between the semiconductor devices and the wiring board, thereby protecting the internal connection terminals.

FIG. 13 illustrates an exemplary structure of a conventional flip-chip-type semiconductor assembly SAP. Also, FIG. 14 illustrates the structure of a multilayer wiring board MBP used in the semiconductor assembly SAP. As shown in FIG. 13, the semiconductor assembly SAP has a semiconductor device SD mounted on one of the principal surfaces of the multilayer wiring board MBP.

As shown in FIG. 14, the multilayer wiring board MBP has insulating layers 3 and 4 laminated on two principal surfaces of an insulating layer (hereinafter, referred to as a "core board") 1 disposed in the middle. The insulating layer 3 is disposed on the flip-chip bonding side with respect to the core board 1, while the insulating layer 4 is disposed on the opposite side to the flip-chip bonding side with respect to the core board 1.

Wire conductors 5 for connection with the semiconductor device SD are provided on the surface (top surface in FIG. 14) of the insulating layer 3. On the other hand, secondary mounting terminal electrodes 8 are provided on the surface (bottom surface in FIG. 14) of the insulating layer 4. The secondary mounting terminal electrodes 8 are used for secondary mounting of the semiconductor assembly SAP onto an unillustrated motherboard. Solder resists 7 are applied between the secondary mounting terminal electrodes 8 in order to avoid short-circuit between adjacent electrodes at the time of the connection with the wire conductors of the motherboard by soldering or suchlike.

Interlayer electrodes 9 are provided between the insulating layer 3 and the core board 1 and between the core board 1 and the insulating layer 4. Also, vias 6 are provided in the insulating layer 3, the core board 1, and the insulating layer 4, so that the wire conductors 5 and the secondary mounting terminal electrodes 8 are electrically connected through the interlayer electrodes 9 and the vias 6.

As shown in FIG. 13, the semiconductor device SD consists of a main element portion 20, electrode pads 21, and bumps 22. The electrode pads 21 are provided on one surface (bottom surface in FIG. 13) of the planar main element portion 20, and the electrode pads 21 are provided with their respective bumps 22. Also, thermo-setting sealing resin 23 is injected between the semiconductor device SD and the multilayer wiring board MBP.

When the sealing resin 23 is cured with the bumps 22 of the semiconductor device SD being pressed hard on the wire conductors 5 of the multilayer wiring board MBP, the semiconductor device SD is fixed to the multilayer wiring board MBP with the bumps 22 in close contact with the wire conductors 5, so that the semiconductor device SD and the multilayer wiring board MBP are electrically connected.

Referring next to FIG. 13, the process for flip-chip mounting the semiconductor device SD onto the multilayer wiring board MBP and warpage of the multilayer wiring board MBP that is produced due to the process will be described.

A prepared multilayer wiring board MBP is placed on an unillustrated metallic stage. Then, a semiconductor device SD is placed on the multilayer wiring board MBP such that uncured sealing resin 23 is positioned between the semiconductor device and the multilayer wiring board MBP, and bumps 21 face wire conductors 5.

Furthermore, an unillustrated heat tool is placed on the semiconductor device SD, and heated while being pressed hard on the semiconductor device SD. The applied pressure deforms the tips of the bumps 22 to such an extent as to achieve satisfactory connections with the wire conductors 5, and the heat applied by the heat tool cures the sealing resin 23, thereby maintaining this state.

When mounting the semiconductor device SD on the multilayer wiring board MBP, the multilayer wiring board MBP and the semiconductor device SD are pressed between the stage and the heat tool, and heated at a temperature of approximately 180° C. The heating horizontally expands the core board 1 and the insulating layers 2, 3, and 4 included in the multilayer wiring board MBP.

After the sealing resin 23 is cured for a predetermined period of time (5 to 10 seconds), the heat and the pressure applied to the heat tool are removed. The core board 1 and the insulating layers 3 and 4 that have expanded horizontally contract as the temperature falls. At this time, the insulating layer 3, which lies at the top, is firmly bonded to the semiconductor device SD via the sealing resin 23.

The thermal expansion coefficient of the semiconductor device SD is considerably lower than that of the insulating layer 3, and therefore the semiconductor device SD prevents contraction of the insulating layer 3. The amounts of contraction of the core board 1 and the insulating layers 2, 3, and 4 are as indicated by horizontal arrows in FIG. 13, and as a result, force is applied to both ends in the directions indicated by arrows C1 and C2, so that the multilayer wiring board MBP is convexly warped.

While the semiconductor assembly SAP thus produced is thereafter mounted on a motherboard, high warpage of the multilayer wiring board MBP reduces the reliability of connecting the secondary mounting terminal electrodes 8 to the wire conductors of the motherboard by soldering.

Patent Document 1 proposes methods for preventing warpage of the multilayer wiring board having the semiconductor device mounted thereon: (1) the multilayer wiring board includes insulating layers of resin materials with different elasticity or thermal expansion coefficients; (2) the insulating layers differ in thickness; and (3) the insulating layers differ in glass cloth content.

Patent Document 1 Japanese Laid-Open Patent Publication No. 2001-217514

DISCLOSURE OF THE INVENTION

Problem to be Solved by the Invention

However, the methods described in Patent Document 1 are based on the premise of so-called reflow soldering in which the semiconductor assembly is exposed to atmosphere at or above a solder melting temperature. On the other hand, the present invention is directed to a flip-chip-type semiconductor assembly having a semiconductor device bonded to a multilayer wiring board under pressing and heating. When mounting the semiconductor device onto the wiring board, pressure is not applied to the semiconductor assembly of Patent Document 1 but to the flip-chip-type semiconductor assembly, and therefore these devices differ in principles in which warpage occurs. Accordingly, even if the methods described in Patent Document 1 are employed for the flip-chip-type semiconductor assembly, any sufficient effect cannot be expected for reducing warpage of the multilayer wiring board.

The present invention has been made in view of the problems as stated above, and an object thereof is to provide a semiconductor assembly in which a multilayer wiring board is prevented from being warped due to heat applied at the time of flip-chip mounting, thereby increasing connection reliability at the time of mounting onto a motherboard.

Means for Solving the Problem

To attain the object as stated above, the present invention provides a semiconductor assembly comprising a multilayer wiring board including at least three generally planar insulating layers laminated on one another, and a semiconductor device attached to one principal surface of the multilayer wiring board, wherein,
the multilayer wiring board further includes a heat-insulating member made of a material having a lower thermal conductivity than the insulating layer, and the heat-insulating member is provided in at least one position between the insulating layers or in a portion of at least one of the insulating layers.

In the semiconductor assembly of the present invention, the multilayer wiring board preferably includes a core board formed by one of the insulating layers, at least one insulating layer laminated on one principal surface of the core board, and at least one insulating layer laminated on the other principal surface of the core board.

Here, the heat-insulating member is preferably a generally planar heat-insulating layer disposed in at least one position between the insulating layers. Only the single heat-insulating layer may be provided and disposed between a first insulating layer acting as the core board and a second insulating layer lying outermost on a side where the semiconductor device is mounted.

Preferably, the heat-insulating layer has provided therein a via penetrating from one of its two principal surfaces to the other, and the via is electrically connected to vias provided in the insulating layers adjacent thereto, via interlayer electrodes.

Here, the heat-insulating member is preferably provided in a position on at least one of the insulating layers excepting two outermost layers, the position being close to an attaching position of the semiconductor device.

Preferably, the heat-insulating member is provided in a third insulating layer disposed between the first insulating layer acting as the core board and the second insulating layer lying outermost on the side where the semiconductor device is mounted, and the heat-insulating member is formed by injecting a material having a low thermal conductivity into a first opening provided in a position on the third insulating layer that faces the semiconductor device.

The heat-insulating member may be provided in the first insulating layer, and the heat-insulating member may be formed by injecting a material having a low thermal conductivity into a second opening provided in a position on the first insulating layer that faces the semiconductor device.

The heat-insulating member may be provided in a third insulating layer disposed between the first insulating layer acting as the core board and the second insulating layer lying outermost on the side where the semiconductor device is mounted, and the heat-insulating member may be formed by injecting a material having a low thermal conductivity into a plurality of first via holes provided in positions on the third insulating layer that are close to a position where the semiconductor device is attached.

The heat-insulating member may be provided in the first insulating layer, and the heat-insulating member may be formed by injecting a material having a low thermal conductivity into a plurality of second via holes provided in positions on the first insulating layer that face the attaching position of the semiconductor device.

In the semiconductor assembly of the present invention, the material having a lower thermal conductivity than the insulating layer is preferably made of insulating resin having inorganic foam incorporated therein. The inorganic foam may contain hollow ceramic particles.

The inorganic foam may contain at least one type selected from among porous silica, foam glass, silica balloon, glass microballoon, shirasu balloon, and quartz microsphere.

Effect of the Invention

According to the present invention, by providing a heat insulating member in at least one position between or in a portion of a plurality of insulating layers included in a multilayer wiring board, thermal conduction in the multilayer wiring board can be prevented, thereby inhibiting the multilayer wiring board from being warped at the time of flip-chip mounting.

BEST MODE FOR CARRYING OUT THE INVENTION

Embodiment 1

Figure 1:
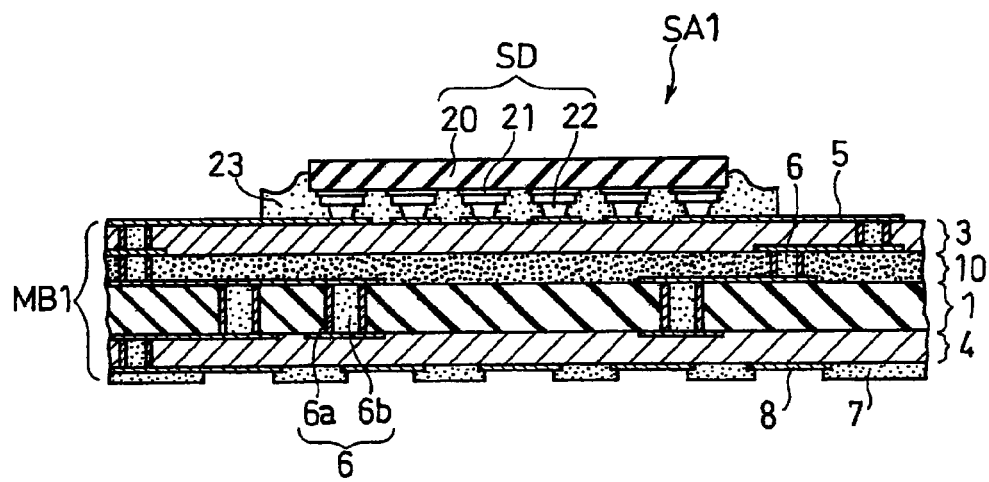
FIG. 1 is a cross-sectional view illustrating the configuration of a semiconductor assembly according to Embodiment 1 of the present invention.
Figure 2:
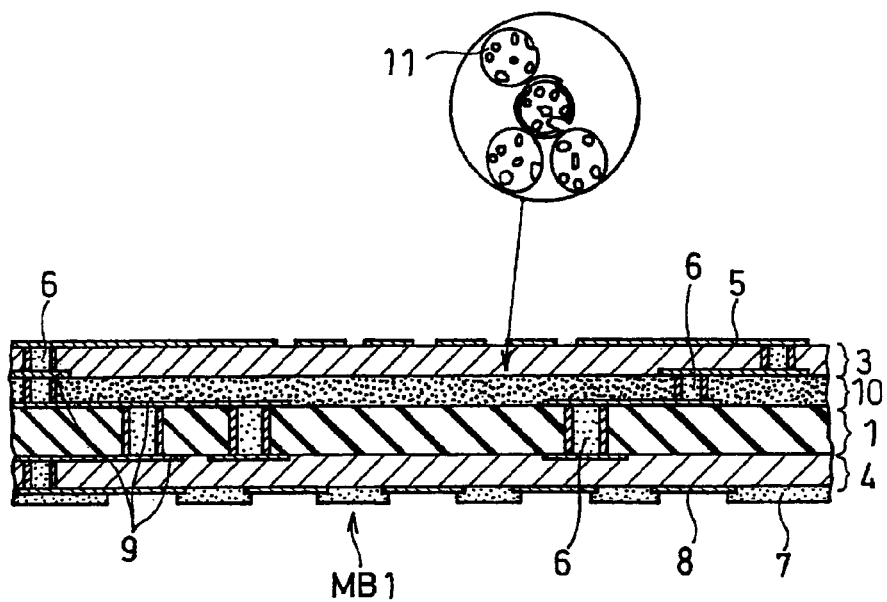
FIG. 2 is a cross-sectional view illustrating the configuration of a multilayer wiring board of FIG. 1.

Referring to FIGS. 1 and 2, a semiconductor assembly according to Embodiment 1 of the present invention will be described. FIG. 1 illustrates in cross-section the semiconductor assembly SA1 according to Embodiment 1 of the present invention. Also, FIG. 2 illustrates in cross-section a multilayer wiring board MB1 included in the semiconductor assembly SA1 of FIG. 1. The semiconductor assembly SA1 is made by flip-chip bonding a semiconductor device SD to a mounting surface of the multilayer wiring board MB1. In the figures, elements having the same functions as in the conventional semiconductor assembly SAP are denoted by the same reference characters, and any repetitive descriptions thereof will be avoided.

As shown in FIG. 2, the multilayer wiring board MB1 has a heat-insulating layer 10 formed on the flip-chip bonding side of a core board 1, which is a first insulating layer; and made of a material (hereinafter, referred to as a "heat-insulating material") having a lower thermal conductivity than the insulating layer, and a second insulating layer 3 is further formed thereon. Also, a third insulating layer 4 is formed on the side opposite to the flip-chip bonding side of the core board 1.

Wire conductors 5 are formed on the surface (in FIG. 1, the top surface) of the second insulating layer 3, and secondary mounting terminal electrodes 8 are formed on the surface (in FIG. 1, the bottom surface) of the third insulating layer 4. As in the conventional semiconductor assembly SAP (see FIG. 13), solder resists 7 are applied between the secondary mounting terminal electrodes 8.

The core board 1, the heat-insulating layer 10, the second insulating layer 3, and the third insulating layer 4 have vias 6 provided therein. The vias 6 each consist of a conductor layer 6a formed on a wall surface of a through-hole (via hole) and insulating resin 6b injected in the via hole. Also, interlayer electrodes 9 are provided between the core board 1 and the heat-insulating layer 10, between the heat-insulating layer 10 and the second insulating layer 3, and between the core board 1 and the third insulating layer 4.

The wire conductors 5 and the secondary mounting terminal electrodes 8 are electrically connected through the vias 6 (specifically, the conductor layers 6a) provided in the core board 1, the heat-insulating layer 10 and the insulating layers 3 and 4, as well as through the interlayer electrodes 9.

The semiconductor device SD consists of a main device 20, an electrode pad 21, and bumps 22. The bumps 22 are joined to the wire conductors 5 under pressure, so that the semiconductor device SD and the multilayer wiring board MB1 are electrically connected. Sealing resin 23 is applied as shown in the figure, thereby bonding the semiconductor device SD to the multilayer wiring board MB1 and maintaining their electrical connection.

As shown in FIG. 1, the multilayer wiring board MB1 has the heat-insulating layer 10 provided between the core board 1 and the second insulating layer 3 as a heat-insulating member. The heat-insulating layer 10 has a lower thermal conductivity than the core board 1, the second insulating layer 3, and the third insulating layer 4. Therefore, heat conducted from the semiconductor device SD to the multilayer wiring board MB1 is prevented by the heat-insulating layer 10 from further being conducted to the core board 1 and the insulating layer 4, so that the multilayer wiring board MS1 can be inhibited from being warped when flip-chip bonding the semiconductor device SD to the multilayer wiring board MB1.

Figure 3:
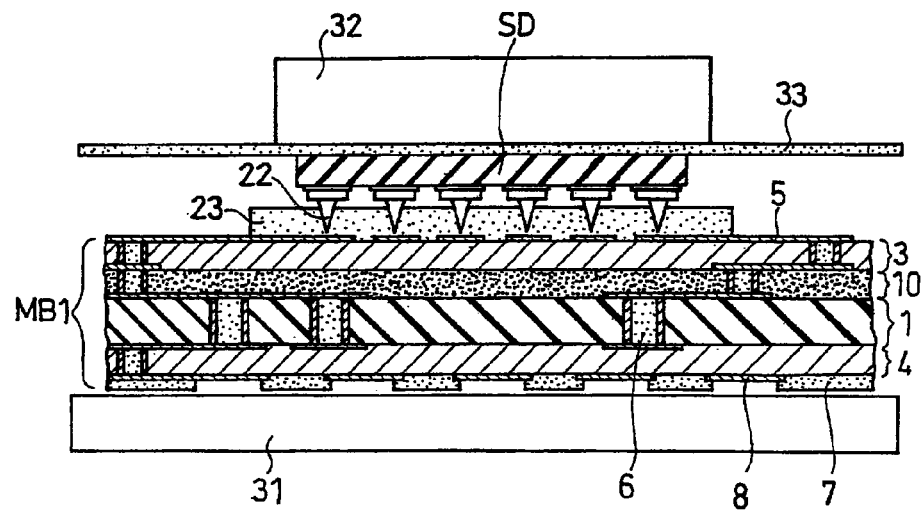
FIG. 3 is an illustration showing a step for producing a semiconductor assembly by flip-chip bonding the semiconductor device to the multilayer wiring board.
Figure 4:
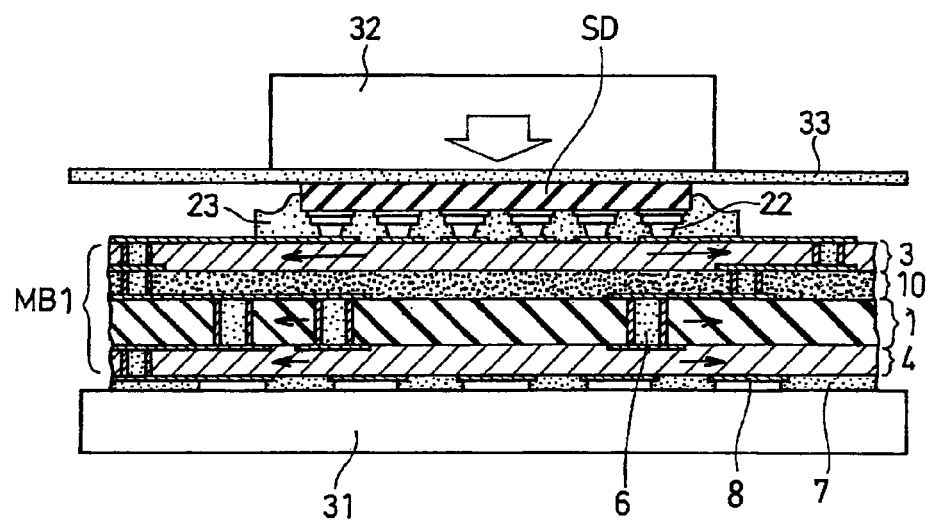
FIG. 4 is an illustration showing a step subsequent to the production step shown in FIG. 3.
Figure 5:
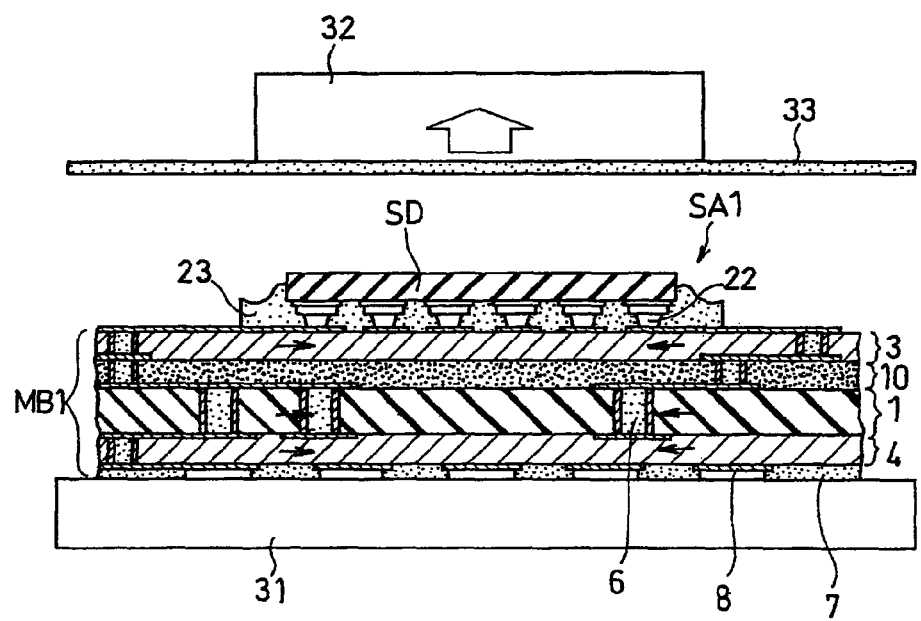
FIG. 5 is an illustration showing a step subsequent to the production step shown in FIG. 4.

Referring to FIGS. 3, 4, and 5, a description will be given as to the reason why the presence of the heat-insulating layer 10 reduces warpage of the multilayer wiring board MB1 due to flip-chip bonding of the semiconductor device SD to the multilayer wiring board MB1. FIGS. 3 to 5 illustrate the steps for flip-chip bonding the semiconductor device SD to the multilayer wiring board MS1. The flip-chip bonding steps are generally classified into pre-pressing and heating step (FIG. 3), pressing and heating step (FIG. 4), and post-pressing and heating step (FIG. 5).

Referring to FIG. 3, the pre-heating and pressing step will be described. A pre-produced multilayer wiring board MB1 is placed on a metallic stage 31. Then, a semiconductor device SD is mounted on the multilayer wiring board MB1 such that a surface on which bumps 22 are formed face downward and uncured sealing resin 23 is positioned between the semiconductor device SD and the multilayer wiring board MB1. At this time, the bumps 22 are positioned on their corresponding wire conductors 5. A heat tool 32 is placed on the semiconductor device SD thus mounted on the multilayer wiring board MB1 via a cover film 33.

Referring next to FIG. 4, the heating and pressing step will be described. The heat tool 32 is moved in the direction indicated by an arrow, thereby pressing the multilayer wiring board MB1 and the semiconductor device SD. The heat tool 32 is heated while maintaining this state. The pressure applied to the heat tool 32 flattens out the tips of the bumps 22 so as to be in contact with the wire conductors 5. Also, the heat applied to the heat tool 32 is conducted through the semiconductor device SD to the sealing resin 23, so that the sealing resin 23 spreads between the semiconductor device SD and the second insulating layer 3.

In this state, the second insulating layer 3, the core board 1, and the third insulating layer 4, which are included in the multilayer wiring board MB1, thermally expand in the directions indicated by arrows. In the figure, the amounts of thermal expansion are represented by the lengths of the arrows. Thermal conduction is prevented by the heat-insulating layer 10, and therefore the amounts of thermal expansion of the core board 1 and the third insulating layer 4 are considerably lower than that of the second insulating layer 3. Note that the amount of thermal expansion of the heat-insulating layer 10 is significantly lower when compared to the core board 1 and the insulating layers 3 and 4, and therefore is not represented by arrows.

When there is a difference in the amount of thermal expansion between the insulating layers included in the multilayer wiring board MB1, the multilayer wiring board MB1 is warped. However, in the state shown in FIG. 4, the heat tool 32 presses the multilayer wiring board MB1 hard against the stage 31 via the semiconductor device SD, and therefore no warpage occurs even when there is a difference in the amount of thermal expansion between the insulating layers of the multilayer wiring board MB1.

Referring to FIG. 5, the post-heating and pressing step will be described. After the heating and pressing step, the heat tool 32, together with the cover film 33, is moved in the direction indicated by an arrow, and separated from the semiconductor device SD connected to the multilayer wiring board MB1 by the sealing resin 23. The sealing resin 23 contracts when cooled, so that the semiconductor device SD is more firmly fixed to the multilayer wiring board MS1. In this manner, the semiconductor assembly SA1 is completed.

At this time, the second insulating layer 3, the core board 1, and the third insulating layer 4 contract by the amounts represented by arrows. In this state, the multilayer wiring board MB1 is not under pressure from the heat tool 32, and therefore the multilayer wiring board MB1 is warped in accordance with the difference in the amount of contraction between the insulating layers.

However, the second insulating layer 3 is firmly connected to the semiconductor device SD by the sealing resin 23, and the amount of contraction of the semiconductor device SD is significantly lower than that of the second insulating layer 3. Therefore, the amount of contraction of the second insulating layer 3 is low. Also, the thermal expansion coefficient of the heat-insulating layer 10 is significantly lower than those of the insulating layers, and therefore the amount of contraction thereof can be ignored.

On the other hand, the amounts of thermal expansion of the core board 1 and the third insulating layer 4 are low by nature because thermal conduction is prevented by the heat-insulating portion 10, and their amounts of contraction are correspondingly low. As a result, the amounts of contraction of the layers in the multilayer wiring board MB1 are considerably low when compared to the case where the heat-insulating layer 10 is not provided, and correspondingly, the multilayer wiring board MB1 is warped by a low degree. In this manner, the multilayer wiring board MB1 is inhibited from being warped at the time of flip-chip bonding.

Returning next to FIG. 2, a description will be given as to the material of each layer included in the multilayer wiring board MB1. Generally used as the core board 1 is a glass-epoxy board made of glass fibers impregnated with epoxy resin or an aramid-epoxy board made of aramid fibers impregnated with epoxy resin. In the present embodiment, a glass-epoxy board is used.

The glass-epoxy board typically has an XY-direction thermal expansion coefficient of about 13 to 15 ppm, which is larger than the thermal expansion coefficient of the aramid-epoxy board, which is typically about 6 to 10 ppm. Also, the glass-epoxy board and the aramid-epoxy board have close glass-transition temperatures Tg, which are respectively 190 to 200° C. and 198° C.

The thermal conductivity is about 0.73 W/m·K for the glass-epoxy board and about 0.5 W/m·K for the aramid-epoxy board, and therefore the glass-epoxy board has a higher thermal conductivity. Furthermore, the glass-epoxy board has an elasticity coefficient of 27 to 30 GPa, and when compared to the aramid-epoxy board having an elasticity coefficient of 7.5 GPa, the glass-epoxy board has a higher elasticity coefficient and is made of a harder base material.

As with the core board 1, the glass-epoxy board or the aramid-epoxy board is used for the second insulating layer 3 and the third insulating layer 4. In the present embodiment, as with the core board 1, glass-epoxy boards are used.

Next, the heat-insulating material used for the heat-insulating layer 10 will be described. The heat-insulating material is a base member made of insulating resin (adhesive) and having low thermally conductive particles (hereinafter, referred to as "heat-insulating particles") 11 dispersed therein. The material for the heat-insulating particles 11 is preferably inorganic foam. In the present embodiment, porous spherical silica microparticles are used as the heat-insulating particles 11.

Porous silica is a material which is made from silica ($SiO_2$) particles as its main component but is hollow, i.e., foamy, the shape of which is shown in magnification in a circle in the figure, and the hollow particles contain in their internal spaces an inert gas, such as nitrogen, oxygen, or argon, or a mixed gas such as air.

In addition to porous silica, foam (microballoons) made of a metallic silicate, such as calcium, magnesium, manganese, cobalt, barium, or lead, can be used for the heat-insulating particles 11.

In addition to the foregoing, foam glass, glass microballoons, shirasu balloons, and quartz microspheres (white microballoons) can be used for the heat-insulating particles 11. Also, a plurality of these materials may be mixed.

Hollow ceramic particles can also be used as the heat-insulating particles 11. Examples of the materials for the hollow ceramic particles include inorganic alumina, sodium borosilicate, shirasu, fly ash, shale, obsidian, volcanic rock, and water-soluble metal salt. At present, hollow ceramic particles of about 2 μm are commercially available.

In order to readily provide the pre-cured heat-insulating layer 10 in the form of a film, the foam ingredients used as the heat-insulating particles 11 are preferably spherical, but they may be in the form of fibers or a mixture of spherical particles and fiber particles. By using microscopical heat-insulating particles of an average grain size of 5 μm or less, preferably, about 1 μm or less, microscopical wire conductors and vias can be formed by, for example, laser processing or etching.

The resin used for the base member of the heat-insulating material 11 is desirably at least one type of resin selected from among epoxy resin, phenol resin, and isocyanate resin. In the present embodiment, epoxy resin is used as in the case of the core board 1 and other insulating layers. Also, for lamination on the core board 1, resin that has been cured to B-stage or prepreg state is used as the base member.

Figure 6:
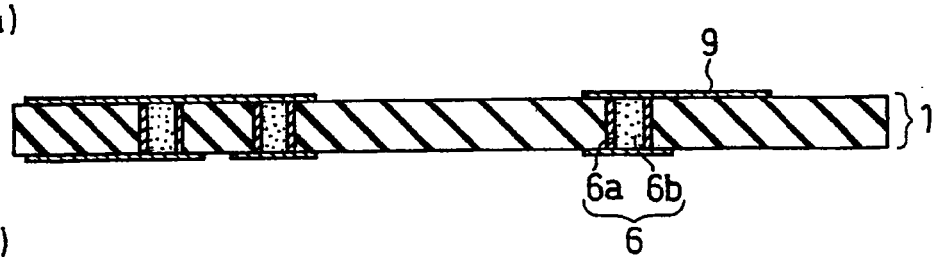
FIG. 6 is an illustration showing the steps for producing the multilayer wiring board of FIG. 1.
Figure 6:
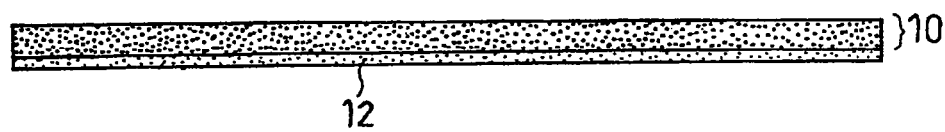
Figure 6:
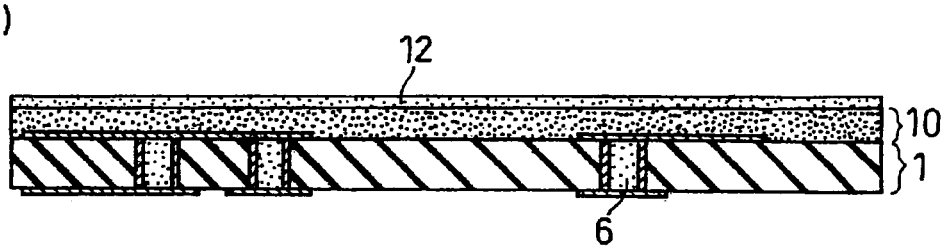
Figure 6:
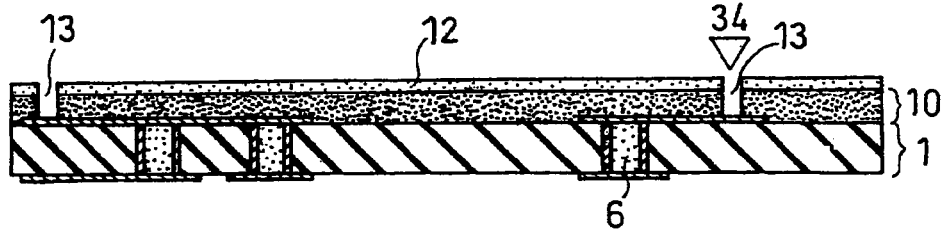
Figure 6:
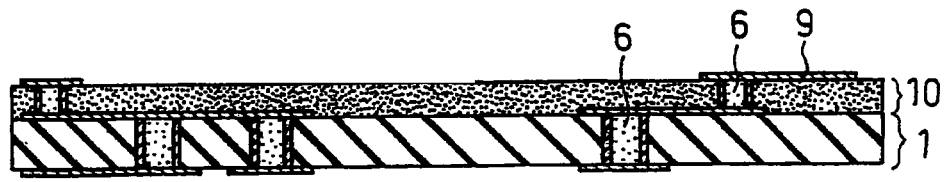
Figure 7:
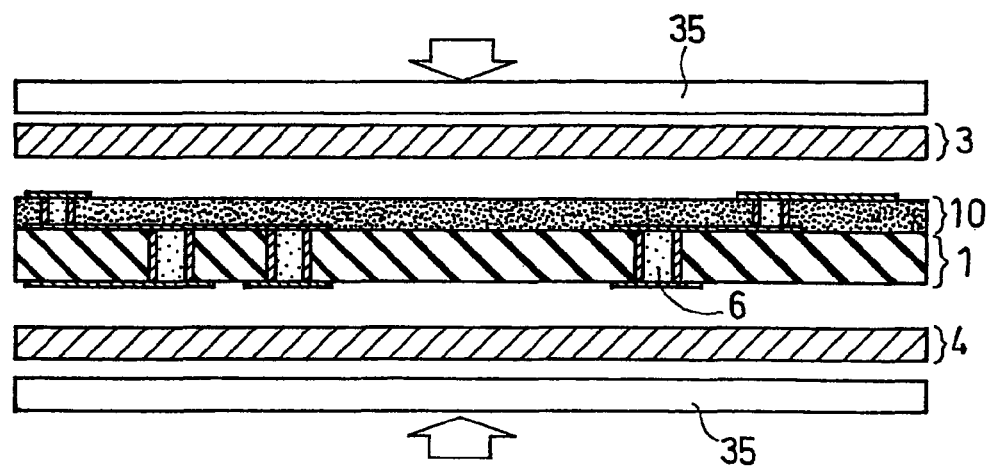
FIG. 7 is an illustration showing steps subsequent to the production steps shown in FIG. 6.
Figure 7:
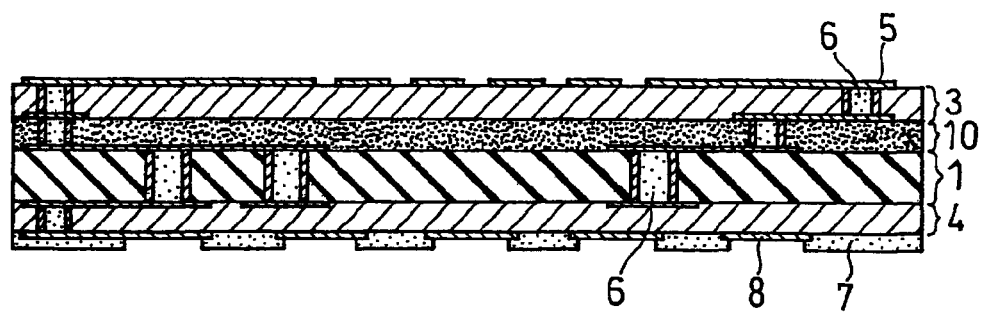

Referring next to FIGS. 6 and 7, the steps for producing the multilayer wiring board MB1 will be described. First, a core board 1 is produced with vias 6 and interlayer electrodes 9 being formed therein/thereon, as shown in FIG. 6(a). One or more prepregs are initially produced by impregnating glass fibers or suchlike with epoxy resin, and stacked on one another. Metal foil (in the present embodiment, copper foil) is further stacked on each or one of the top and bottom surfaces thereof, and the stack is shaped under heat and pressure using a pressing machine. In this manner, a double- or single-side copper foiled laminate to be the core board 1 is produced.

Next, through-holes (via holes) are formed between the copper foils provided on two principal surfaces of the core board 1 (in the case of the double-side copper foiling) by drilling or suchlike, and wall surfaces of the via holes are plated with copper, thereby forming conductor layers 6a. At this time, superficial layers of the principal surfaces of the core board 1 are also plated with copper, so that they are electrically connected with the conductor layers 6a formed on the wall surfaces of the via holes.

Thereafter, insulating resin 6b, such as epoxy resins, is injected into the via holes by screen printing or suchlike. Note that a conductive adhesive may be injected into the via holes. Then, a photoresist is applied to the surfaces of the copper foils, and thereafter the copper foils are processed by photolithography and etching, thereby forming predetermined wiring patterns acting as interlayer electrodes 9.

Next, as shown in FIG. 6(b), insulating resin (adhesive) incorporating heat-insulating particles 11 is applied to a separator 12, thereby forming a heat-insulating layer 10. Note that a releasable film, such as teflon, is used as the separator 12, and the thickness thereof is such that holes can be made by laser beams. In the present embodiment, a teflon film of about 10 μm in thickness is used as the separator 12.

Next, as shown in FIG. 6(c), the heat-insulating layer 10 is laminated on the flip-chip bonding side of the core board 1 such that the separator 12 faces upward. Then, the heat-insulating layer 10 is bonded to the core board 1 by hot pressing. Specific conditions for hot pressing are, for example: temperature 200° C.; pressure 3 MPa; and pressure time 180 min.

Next, as shown in FIG. 6(d), through-holes (via holes) 13 are formed in predetermined positions in the heat-insulating layer 10 by laser beams 34. Any laser, including a $CO_2$ laser, a YAG laser, an excimer laser, etc., can be used so long as microfabrication is possible.

After peeling the separator 12 off the heat-insulating layer 10, conductor layers 6a are formed by copper plating the wall surfaces of the via holes 13 in the heat-insulating layer 10, and a copper-plated layer is formed on the surface of the heat-insulating layer 10. Thereafter, insulating resin is injected to the via holes by screen printing or suchlike. Then, in the same manner as for the core board 1, a photoresist is applied to the copper-plated layer, which thereafter is exposed and etched to form interlayer electrodes 9 as shown in FIG. 6(e).

Next, as shown in FIG. 7(a), prepreg-state insulating layers made of glass fibers impregnated with epoxy resin are laminated such that the core board 1 and the heat-insulating layer 10 are positioned therebetween. In this state, hot pressing is performed using a pair of pressing plates 35 while applying pressure in the directions indicated by arrows, so that the resin is cured to form a second insulating layer 3 and a third insulating layer 4. Note that the insulating layers 3 and 4 may be copper-foiled.

Then, as shown in FIG. 7(b), via holes are formed in the second insulating layer 3 and the third insulating layer 4 by a laser or suchlike. Thereafter, in the same manner as for the core board 1, vias 6 are formed in the insulating layers 3 and 4, and wire conductors 5 and terminal electrodes 8 are formed on the surfaces of the insulating layers 3 and 4. Lastly, solder resists 7 are formed in predetermined positions, thereby completing the multilayer wiring board MB1.

Next, the semiconductor assembly SA1 in the present embodiment using the multilayer wiring board MB1 thus produced was tested for the degree of warpage of the multilayer wiring board given the presence or absence of the heat-insulating layer.

First, the specifications of the tested semiconductor assembly SA1 will be described. The semiconductor assembly SA1 was prepared with a 10 mm×10 mm semiconductor device MB1 flip-chip bonded to a mounting surface of a 15 mm×15 mm multilayer wiring board MB1. The core board 1 was 80 μm thick, the second insulating layer 3 and the third insulating layer 4 were 20 μm thick, the heat-insulating layer 10 was 20 μm thick, and the wire conductors 5, the terminal electrodes 8, and the interlayer electrodes were 20 μm thick. These values totaled to 240 μm, which is the thickness of the multilayer wiring board MB1. Also, the thickness of the semiconductor device SD was 150 μm.

When thermally cured, the heat-insulating layer 10 used contained epoxy resin containing 50 wt % of porous spherical silica with the average grain size being 5 μm or less. The porous silica had a thermal conductivity of 0.05 W/m·K, and the heat-insulating layer 10 had a thermal conductivity of 0.089 W/m·K at 200° C. On the other hand, the core board 1 and the insulating layers 3 and 4 that were used included glass fibers impregnated with epoxy resin. Their thermal conductivities were both 0.73 W/m·K.

Figure 13:
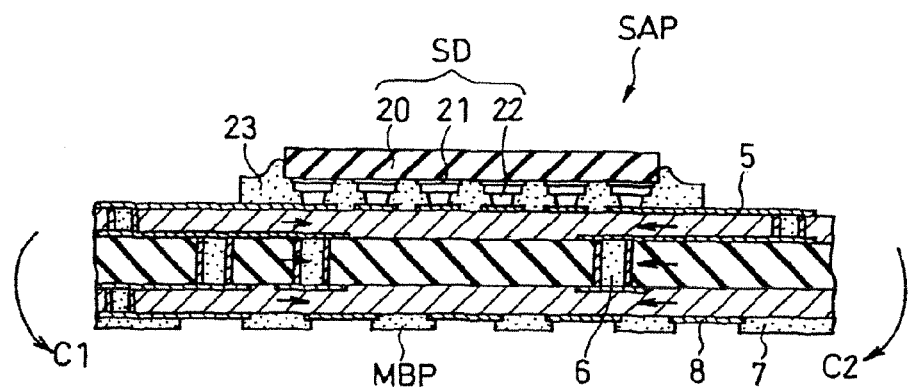
FIG. 13 is a cross-sectional view illustrating the configuration of a conventional semiconductor assembly.
Figure 14:
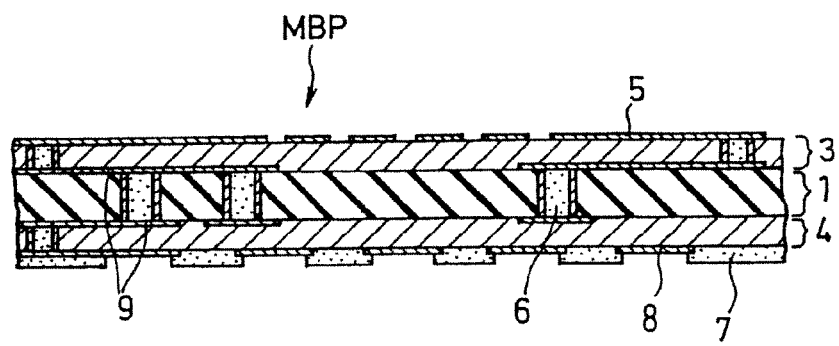
FIG. 14 is a cross-sectional view illustrating the configuration of a multilayer wiring board of FIG. 13.

For comparisons, the conventional semiconductor assembly SAP shown in FIG. 13 was also measured for warpage of the multilayer wiring board MBP. The multilayer wiring board MBP had the same size as the multilayer wiring board MB1. Also, the core board 1 and the insulating layers 3 and 4 had the same composition as the multilayer wiring board MB1. The insulating layer 2 was 20 μm thick, and had the same composition as the insulating layers 3 and 4.

Table 1 shows temperatures and amounts of warpage measured at a plurality of locations for each of the semiconductor assembly SA1 and the semiconductor assembly SAP. In Table 1, the horizontal axis represents the name sample (SA1 or SAP), while the vertical axis represents the temperature and the amount of warpage for each portion. The value of the thermal conductivity of the heat-insulating layer or the insulating layer is parenthesized below the sample name. The temperature measurement results are for the heat tool 32, the top surface of the heat-insulating layer 10 (in the case of the MSP, the top surface of the insulating layer 2), the top surface of the core board 1, the bottom surface of the core board 1, and the stage 31. Also, the amount of warpage is for a region (10 mm×10 mm) on the back surface of the multilayer wiring board that faces the semiconductor device SD.

TABLE 1

|  |  | Sample name (Thermal conductivity) | | |
| --- | --- | --- | --- | --- |
|  |  | SAP (0.73 W/m·K) | SA1 (0.089 W/m·K) | SA1-S (0.02 W/m·K) |
| Temperature of each portion (° C.) | Heat tool | 180 | 180 | 180 |
|  | Heat-insulating layer top surface | 144.5 | 158.6 | 171.4 |
|  | Core board top surface | 132.7 | 100 | 70 |
|  | Core board bottom surface | 85.5 | 71.4 | 58.6 |
|  | Stage | 50 | 50 | 50 |
| Amount of warpage (μm) | | 112.2 | 78.2 | 46.9 |

In this test, the temperature of each portion is measured while maintaining the temperatures of the heat tool 32 and the stage 31 at 180° C. and 50° C., respectively. The temperature of the core board 1 greatly varies depending on whether the heat-insulating layer 10 is present or not. As shown in Table 1, in the case where the heat-insulating layer 10 is not present (SAP), the temperature of the top surface of the core board 1 is 132.7° C., while it is 100° C. when the heat-insulating layer 10 is present (SA1).

In the case where the heat-insulating layer 10 is present, i.e., in the case of the semiconductor assembly SA1, the board is warped by 78.2 μm, while in the case where the heat-insulating layer 10 is not present, i.e., in the case of the semiconductor assembly SAP, the board is warped by 112.2 μm. In the case where a semiconductor assembly having a 10 mm×10 mm semiconductor device mounted thereon is secondarily mounted on a motherboard, the amount of warpage of the multilayer wiring board (the amount of warpage of the region that faces the semiconductor device) is required to be within 100 μm. While the conventional semiconductor assembly SAP including no heat-insulating layer does not satisfy that requirement, the semiconductor assembly SA1 of the present embodiment that is provided with the heat-insulating layer 10 fully satisfies the requirement.

For reference, Table 1 shows simulation results for the temperature and the amount of warpage of each portion where sample SA1-S has provided therein a heat-insulating layer having a thermal conductivity of 0.02 W/m·K. In order to achieve the heat-insulating layer having a thermal conductivity of 0.02 W/m·K, it is necessary to use heat-insulating particles having an extremely low thermal conductivity. If such heat-insulating particles were used to provide a heat-insulating layer, the amount of warpage of the multilayer wiring board would be 46.9 μm, which is superior even when compared to the semiconductor assembly SA1. From the results of the test and the simulation, it can be appreciated that the heat-insulating material preferably has a thermal conductivity in the range from 0.02 to 0.1 W/m·K.

From the test, the following facts are found. Specifically, the heat-insulating layer 10 makes it possible to inhibit thermal conduction to the core board 1 and the third insulating layer 4 by a difference in temperature of about 32° C. In the case where the semiconductor device SD is actually mounted onto the multilayer wiring board MB1, flip-chip bonding of the semiconductor device SD takes about 10 seconds, during which thermal conduction progresses within the wiring board, and therefore the effect of temperature suppression is reduced compared to the test. However, it is quite possible to reduce the warpage of the board by further tens of μm, thereby reducing the amount of warpage within 100 μm at the time of mounting onto the motherboard.

Note that in the present embodiment, the heat-insulating layer 10 is disposed between the core board 1 and the second insulating layer 3, but the position in which to dispose the heat-insulating layer 10 is not limited to this. In the case where a plurality of insulating layers are formed between the core board 1 and the second insulating layer 3, the same effect as in the present embodiment can be achieved by disposing the heat-insulating layer between any of the layers. Furthermore, the heat-insulating layer may be interposed between the core board 1 and the third insulating layer 4. In this case, since the amount of thermal expansion of the core board 1 cannot be reduced, the effect of inhibiting warpage is lower when compared to the present embodiment, but no problem is posed if the tolerable range of warpage is wide.

Note that it is conceivable to structure the core board 1 using heat-insulating layers or provide the heat-insulating layer as the outermost layer of the multilayer wiring board, but it is advisable to avoid such a structure when possible. The core board 1 is a main member for maintaining the strength of the multilayer wiring board, and therefore it is reinforced by a number of glass fibers. On the contrary, the heat-insulating layer has heat-insulating particles dispersed in insulating resin, and therefore it is inferior in terms of strength and not preferable for use as a portion intended for maintaining the strength.

The same applies to the case where the heat-insulating layer is provided as the outermost layer of the multilayer wiring board. Typically, wiring patterns are formed on the outermost layer, and connected to an electronic component such as a semiconductor device. Mounting of an electronic component through soldering or suchlike imposes thermal and mechanical loads on the outermost layer, and therefore it is not preferable to dispose the heat-insulating layer, which has a low mechanical strength, in that position.

Also, in the present embodiment, thermo-setting epoxy resin is used as the base member of the heat-insulating layer 10, but ultraviolet curable epoxy resin may be used. Ultraviolet curing makes it possible to inhibit warpage due to initial thermal expansion. Moreover, if necessary, a substance included in a typical thermo-setting resin composition, e.g., thermal stabilizer, antistatic agent, ultraviolet absorbing agent, flame retardant, dye or pigment, or lubricant, may be additionally added to the heat-insulating layer 10.

Also, in the case of a mounting method in which the semiconductor device SD is flip-chip bonded, solder or a conductive adhesive may be employed for connection instead of using the sealing resin 23. Furthermore, the structure of the present invention is not restrictively applied to semiconductor devices of CSP type, and can be applied to surface-mounting components in general, including, for example, QFP, BGA, and MCM types. Moreover, as for the insulating layers to be included in the multilayer wiring board, materials of wiring patterns, etc., various layers and materials can be employed without departing from the scope. In addition, the sealing resin 23 may contain a heat-insulating material (foam).

Embodiment 2

Figure 8:
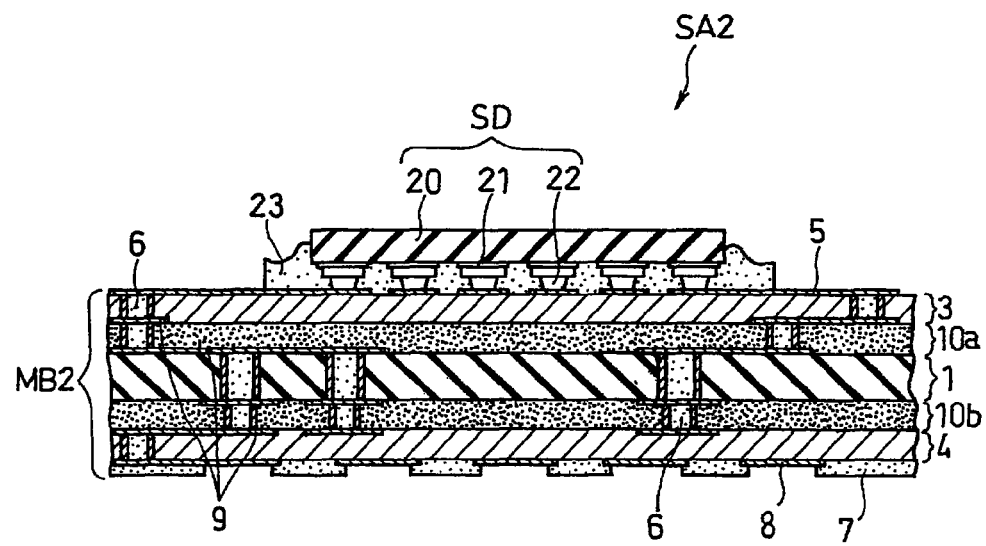
FIG. 8 is a cross-sectional view illustrating the configuration of a semiconductor assembly according to Embodiment 2 of the present invention.

Referring to FIG. 8, a semiconductor assembly according to Embodiment 2 of the present invention will be described. The semiconductor assembly SA2 according to the present embodiment includes a multilayer wiring board MB2 in place of the multilayer wiring board MB1 in the semiconductor assembly SA1 of Embodiment 1.

As shown in FIG. 8, the multilayer wiring board MB2 has two heat-insulating layers provided therein. Specifically, the first heat-insulating layer 10a is provided between the core board 1 and the second insulating layer 3, and the second heat-insulating layer 10b is provided between the core board 1 and the second insulating layer 4.

The first heat-insulating layer 10a and the second heat-insulating layer 10b are configured in the same manner as the heat-insulating layer 10. Moreover, each of the first and second heat-insulating layers 10a and 10b has vias 6 and interlayer electrodes 9 formed therein/thereon, and the vias 6 and the interlayer electrodes 9 are electrically connected to vias 6 and interlayer electrodes 9 provided in/on the insulating layer 3, the core board 1, and the insulating layer 4.

Providing the heat-insulating layers 10a and 10b on opposite sides of the core board 1 is disadvantageous in that production cost of the multilayer wiring board increases, but at the same time, heat of the heat tool 32 (see FIG. 4) is effectively prevented from being conducted to the third insulating layer 4. As a result, the multilayer wiring board MB2 can be further inhibited from being warped after flip-chip bonding (after temperature fall).

Embodiment 3

Figure 9:
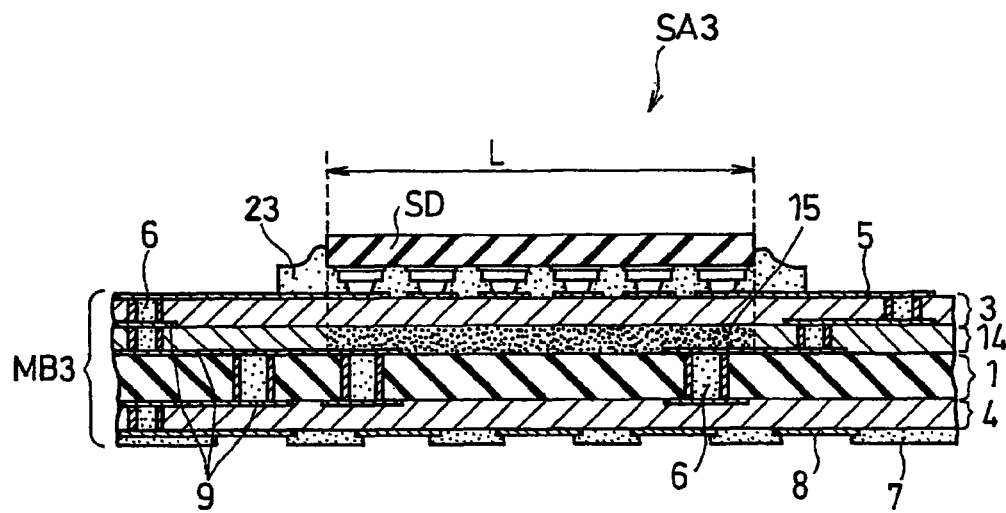
FIG. 9 is a cross-sectional view illustrating the configuration of a semiconductor assembly according to Embodiment 3 of the present invention.

Referring to FIG. 9, a semiconductor assembly according to Embodiment 3 of the present invention will be described. As shown in FIG. 9, the semiconductor assembly SA3 according to the present embodiment includes a multilayer wiring board MB3 in place of the multilayer wiring board MB1 in the semiconductor assembly SA1 of Embodiment 1.

The multilayer wiring board MB1 has the heat-insulating layer 10 formed across the flip-chip bonding side of the core board 1 (between the core board 1 and the second insulating layer 3). On the other hand, the multilayer wiring board MB3 has a heat-insulating member 15 provided only in a portion of a third insulating layer 14 disposed between the core board 1 and the second insulating layer 3.

To describe it concretely, the heat-insulating member 15 is made of a heat-insulating material injected into an opening of the third insulating layer 14 that is provided at a position close to an attaching position of the semiconductor device SD. The heat-insulating material is substantially the same as the heat-insulating material described in Embodiment 1.

In FIG. 9, "L" denotes the length of one side of the semiconductor device SD. Specifically, in the present embodiment, the heat-insulating member 15 is provided in a position that faces the semiconductor device SD, and in a shape corresponding to the shape of the semiconductor device SD.

The following describes the reason why the heat-insulating member 15 is provided only in the position close to the attaching position of the semiconductor device SD. While the heat-insulating layer 10 of Embodiment 1 is fully effective in reducing warpage of the wiring board, the heat-insulating material is expensive, leading to an increase in cost of the semiconductor assembly. The heat-insulating material is produced by mixing low thermal conductivity particles, such as porous spherical silica microparticles, with thermo-setting resin. Such particles are limited in application, and therefore expensive compared to glass fibers and suchlike.

In the position on the multilayer wiring board that is close to the attaching position of the semiconductor device SD, the amount of expansion is higher than in other positions because of heat being conducted through the semiconductor device SD. In other words, the amount of expansion is low in positions away from the attaching position of the semiconductor device SD, and therefore even when the heat-insulating member is removed therefrom, impact on warpage inhibition is small. On the other hand, providing the heat-insulating member only in the position close to the attaching position of the semiconductor device SD achieves lower cost than in the case where the heat-insulating layer 10 is provided.

Next, a method for producing the multilayer wiring board MB3 will be described. Since the processes for producing the core board 1 and the insulating layers 3 and 4 are the same as those for the multilayer wiring board MB1 described in Embodiment 1, only the process for producing the fourth insulating layer 14 will be described here.

First, a prepreg is produced by impregnating glass fibers or suchlike with thermo-setting resin such as epoxy resin. The prepreg has releasable films (separators), such as PETs, attached to opposite surfaces.

Then, an opening in the shape corresponding to the semiconductor device SD is made in a predetermined position on the prepreg by a punching device.

Subsequently, a paste-like heat-insulating material made of heat-insulating particles dispersed in a base member, such as epoxy resin, is injected into the opening by screen printing while wiping the material with a squeegee. The injected heat-insulating material may be slightly mounded up over the opening. It is compressed into a flat form at the time of pressing.

Then, the separator attached to one surface of the prepreg is peeled, and the prepreg and the base member are placed in position on the core board 1 and thereafter cured under pressure and heat by the pressing machine. In this manner, the insulating layer 14 is formed with the heat-insulating member 15 on the core board 1.

Next, via holes are formed by irradiating via connection portions of the insulating layer 14 with laser beams from above the separator. Thereafter, wall surfaces of the via holes are copper-plated to form conductor layers, and also a copper-plated layer is formed on the surface of the insulating layer 14. Furthermore, insulating resin is injected into the via holes by screen printing or suchlike. Then, in the same manner for the core board 1, a photoresist is applied to the copper-plated layer, which thereafter is exposed and etched to faun desired wiring patterns (interlayer electrodes 9).

The insulating layer 14 is readily produced compared to the heat-insulating layer 10, and specifically, the insulating layer 14 is produced by impregnating glass fibers or suchlike with thermo-setting resin such as epoxy resin. Such a method for producing the insulating layer is well-established, and requires low cost. Also, the multilayer wiring board can be produced by repeating the same step to stack prepreg-state insulating layers, and therefore the whole process is simple.

As described above, the multilayer wiring board MB3 of the present embodiment has the heat-insulating member 15 formed only in the position on the third insulating layer 14 that faces the mounting position of the semiconductor device SD. Therefore, in the case of the semiconductor assembly SA3, the cost required for the heat-insulating member 15 can be reduced while inhibiting the multilayer wiring board MB3 from being warped at the time of flip-chip bonding.

Note that in the present embodiment, the heat-insulating member 15 has a width equal to the width L of the semiconductor device SD, but this is not restrictive. In order to prevent heat from being conducted around the insulating layer 14, which surrounds the heat-insulating member 15, to the core board 1, the heat-insulating member may be shaped to be slightly larger than the semiconductor device SD.

Embodiment 4

Figure 10:
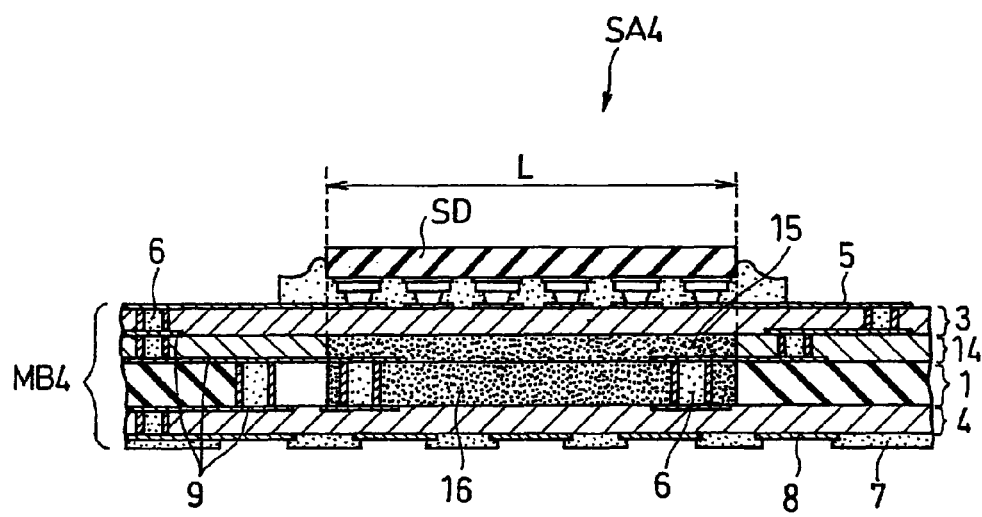
FIG. 10 is a cross-sectional view illustrating the configuration of a semiconductor assembly according to Embodiment 4 of the present invention.

Referring to FIG. 10, a semiconductor assembly according to Embodiment 4 of the present invention will be described.

As shown in FIG. 10, the semiconductor assembly SA4 according to the present embodiment includes a multilayer wiring board MB4 in place of the multilayer wiring board MB3 in the semiconductor assembly SA3 according to the third embodiment.

Specifically, while the multilayer wiring board MB3 has the heat-insulating member 15 provided in a portion of the third insulating layer 14 disposed between the core board 1 and the second insulating layer 3, the multilayer wiring board MB4 additionally has a heat-insulating member 16 provided in a portion of the core board 1.

As shown in FIG. 10, the heat-insulating member 16 provided in the core board 1 has a width equal to the width L of the heat-insulating member 15 provided in the insulating layer 14. Also, the heat-insulating material for forming the heat-insulating member 16 is also substantially the same as the heat-insulating material for forming the heat-insulating member 15. The process for forming the heat-insulating member 16 in the core board 1 is basically the same as the process for forming the heat-insulating member 15 in the insulating layer 14, and therefore any description thereof will be omitted herein.

By providing heat-insulating members (15, 16) in both the insulating layer 14 and the core board 1, heat is blocked from being conducted through the fourth insulating layer 14, the core board 1, and the third insulating layer 4 when flip-chip mounting the semiconductor device SD to the multilayer wiring board MB4, so that the multilayer wiring board MB4 is further inhibited from being warped. Also, the amount of heat-insulating material used for the heat-insulating members 15 and 16 can be kept to the minimum necessary, and therefore an increase in cost of the semiconductor assembly SA4 is minimized.

Embodiment 5

Figure 11:
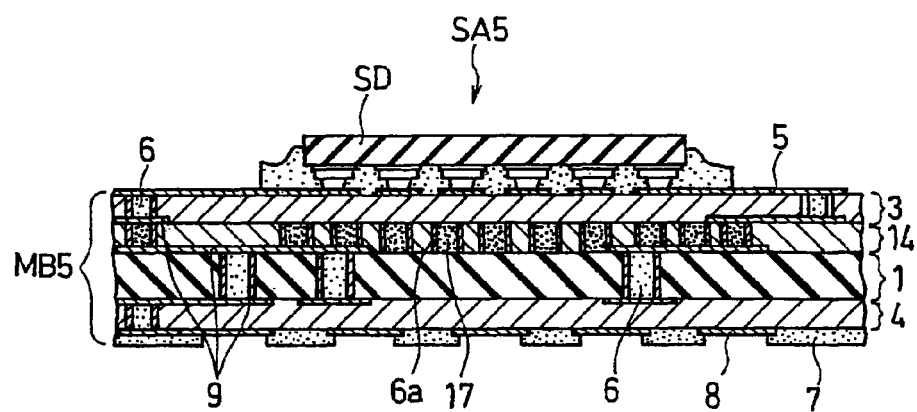
FIG. 11 is a cross-sectional view illustrating the configuration of a semiconductor assembly according to Embodiment 5 of the present invention.

Referring to FIG. 11, a semiconductor assembly according to Embodiment 5 of the present invention will be described. As shown in FIG. 11, the semiconductor assembly SA4 according to the present embodiment includes a multilayer wiring board MB5 in place of the multilayer wiring board MB3 in the semiconductor assembly SA3 according to the third embodiment.

Specifically, the multilayer wiring board MB3 has the heat-insulating member 15 formed by providing an opening in a portion of the third insulating layer 14 that faces the semiconductor device SD, and injecting a heat-insulating material into the opening. On the other hand, the multilayer wiring board MB5 has heat-insulating members 17 provided by forming a plurality of via holes in positions in the insulating layer 14 that are close to the attaching position of the semiconductor device SD, and injecting a heat-insulating material into each of the via holes. That is, in the present embodiment, the heat-insulating member is intended to mean a collection of heat-insulating members 17 obtained by injecting the heat-insulating material into the via holes.

The heat-insulating members 17 obtained by injecting a heat-insulating material into via holes have inferior capabilities of inhibiting thermal conduction when compared to the heat-insulating member 15 obtained by injecting a heat-insulating material into an opening. However, the heat-insulating members 17 can be formed by a process similar to the process for forming the vias 6. As a result, there is little difference in production cost between the multilayer wiring board MB5 and the conventional multilayer wiring board MBP. Accordingly, the semiconductor assembly SA5 is superior in production cost compared to the semiconductor assembly SA3.

The process for producing the insulating layer 14 is basically the same as the processes for producing the insulating layers 3 and 4, and therefore any description thereof will be omitted herein. The production of the insulating layer 14 differs from the production of the insulating layers 3 and 4 in that a number of via holes are formed in positions close to the attaching position of the semiconductor device SD, and a heat-insulating material, rather than insulating resin, is injected to the via holes.

While conductor layers 6a are formed on wall surfaces of the via holes included in the heat-insulating members 17, the conductor layers 6a may or may not be connected to interlayer electrodes 9. The conductor layers 6a and the heat-insulating members 17 connected to the interlayer electrodes 9 function in the same manner as the vias 6.

Embodiment 6

Figure 12:
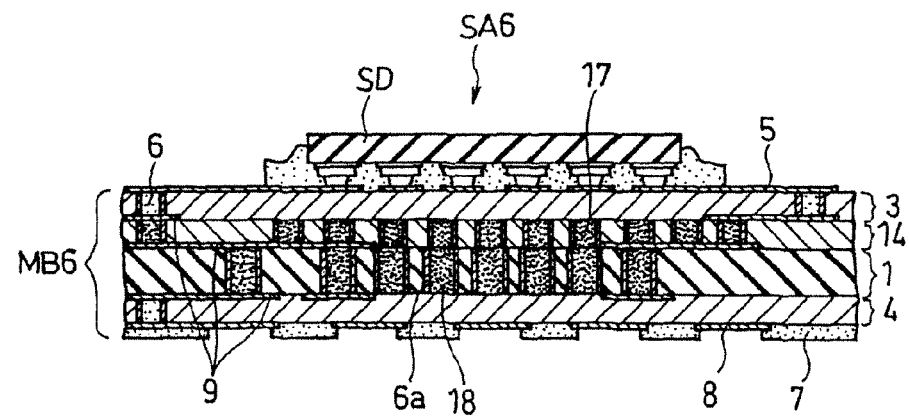
FIG. 12 is a cross-sectional view illustrating the configuration of a semiconductor assembly according to Embodiment 6 of the present invention.

Referring to FIG. 12, a semiconductor assembly according to Embodiment 6 of the present invention will be described. As shown in FIG. 12, the semiconductor assembly SA6 according to the present embodiment includes a multilayer wiring board MB6 in place of the multilayer wiring board MB5 in the semiconductor assembly SA5 according to the fifth embodiment.

Specifically, while the multilayer wiring board MB5 has the heat-insulating members 17 provided in a portion of the third insulating layer 14 disposed between the core board 1 and the second insulating layer 3, the multilayer wiring board MB6 additionally has heat-insulating members 18 in a portion of the core board 1, which are similar in shape to the heat-insulating members 17.

As shown in FIG. 12, the heat-insulating members 18 are formed by injecting a heat-insulating material into via holes in positions in the core board 1 that are close to the attaching position of the semiconductor device SD. The heat-insulating material injected into the heat-insulating members 18 is substantially the same as the heat-insulating material injected into the heat-insulating members 17. Note that the process for forming the heat-insulating members 18 in the core board 1 is the same as the process for forming the heat-insulating members 17 in the insulating layer 14, and therefore any description thereof will be omitted herein.

By providing heat-insulating members (17, 18) in both the insulating layer 14 and the core board 1, the multilayer wiring board MB6 can be further inhibited from being warped when flip-chip mounting the semiconductor device SD to the multilayer wiring board MB6 when compared to the multilayer wiring board MB5. Also, the process for producing the vias 6 can be diverted to production of the heat-insulating portions 17 and 18, and therefore the cost of producing the semiconductor assembly SA6 can be kept low.

INDUSTRIAL APPLICABILITY

The present invention is applicable to, for example, compact, low-profile semiconductor assemblies having a semiconductor device flip-chip mounted to a multilayer wiring board.

The invention claimed is:
1. A semiconductor assembly comprising:
a multilayer wiring board including at least three insulating layers including first, second and third insulating layers; and
a semiconductor device attached to one principal surface of the first insulating layer of the multilayer wiring board, wherein:

the first, second and third insulating layers are stacked in this order, the multilayer wiring board further includes a heat-insulating member made of a material having a lower thermal conductivity than the insulating layers, and the heat-insulating member is disposed between the first and second insulating layers or disposed in the second insulating layer.

2. The semiconductor assembly according to claim 1, wherein the multilayer wiring board includes a core board formed as the second insulating layer, the heat-insulating member is laminated on one principal surface of the core board, and the third insulating layer is laminated on the other principal surface of the core board.

3. The semiconductor assembly according to claim 1, wherein:

the heat-insulating layer has provided therein a via penetrating from one of its two principal surfaces to the other, and the via is electrically connected to vias provided in the insulating layers adjacent thereto, via interlayer electrodes.

4. The semiconductor assembly according to claim 1, wherein:

the multilayer wiring board further includes a fourth insulating layer between the first and second insulating layers, and the heat-insulating member is formed in the fourth insulating layer by injecting the material having a low thermal conductivity into a first opening provided in a position on the fourth insulating layer that faces the semiconductor device.

5. The semiconductor assembly according to claim 4, wherein:

another heat-insulating member is provided in the second insulating layer, and the another heat-insulating member is formed in the second insulating layer by injecting a material having a low thermal conductivity into a second opening provided in a position on the second insulating layer that faces the semiconductor device.

6. The semiconductor assembly according to claim 1, wherein:

the multilayer wiring board further includes a fourth insulating layer between the first and second insulating layers, and the heat-insulating member is formed in the fourth insulating layer by injecting the material having a low thermal conductivity into a plurality of first via holes provided in positions on the fourth insulating layer that are close to a position where the semiconductor device is attached.

7. The semiconductor assembly according to claim 6, wherein:

another heat-insulating member is provided in the second insulating layer, and the another heat-insulating member is formed in the second insulating layer by injecting a material having a low thermal conductivity into a plurality of second via holes provided in positions on the second insulating layer that face the attaching position of the semiconductor device.

8. The semiconductor assembly according to claim 1, wherein the material having a lower thermal conductivity than the insulating layer is made of insulating resin having inorganic foam incorporated therein.

9. The semiconductor assembly according to claim 8, wherein the inorganic foam includes at least one selected from among porous silica, foam glass, silica balloon, glass microballoon, shirasu balloon, and quartz microsphere.

10. The semiconductor assembly according to claim 8, wherein the inorganic foam includes hollow ceramic particles.

11. The semiconductor assembly according to claim 1, wherein the heat-insulating member overlaps at least partially with a shape of the semiconductor device in a plan view.

12. The semiconductor assembly according to claim 1, wherein the heat-insulating member is not exposed in the one principal surface of the first insulating layer of the multilayer wiring board.

* * * * *